United States Patent [19]
Lepailleur

[11] Patent Number: 5,742,657
[45] Date of Patent: Apr. 21, 1998

[54] FAST DIGITAL SHIFT REGISTER AND ARRANGEMENT COMPRISING SUCH A REGISTER

[75] Inventor: Laurent Lepailleur, Caen, France

[73] Assignee: U.S. Philips Corporation, New York, N.Y.

[21] Appl. No.: 905,313

[22] Filed: Oct. 30, 1995

Related U.S. Application Data

[63] Continuation of Ser. No. 148,103, Nov. 3, 1993, abandoned.

[30] Foreign Application Priority Data

Nov. 12, 1992 [FR] France .................................. 9213613

[51] Int. Cl.$^6$ ........................................ G11C 19/00
[52] U.S. Cl. .............................. 377/73; 377/78
[58] Field of Search ..................... 377/70, 73, 77, 377/78

[56] References Cited

U.S. PATENT DOCUMENTS

| | | | |
|---|---|---|---|
| 3,949,384 | 4/1976 | Lohmann | 377/70 |
| 5,113,419 | 5/1992 | Kasperkovitz | 377/78 |
| 5,150,389 | 9/1992 | Kawasaki | 377/73 |

FOREIGN PATENT DOCUMENTS 2507807  12/1982  France .

OTHER PUBLICATIONS

Langmann, "A 2.25-GHz silicon bipolar shift register", Proceedings of the 1987 bipolar circuits and technology meeting, pp. 109–112. of The IEEE Electron Devices Society.

"Analysis and Improvement of a Static Shift Register" D. Kasperkovitz, Microelectronics & Reliability, pp. 501–515, Paragon Press 1974.

*Primary Examiner*—Margaret Rose Wambach
*Attorney, Agent, or Firm*—Robert M. McDermott

[57] ABSTRACT

A digital shift register contains a succession of master-slave flipflops (M/S) which are controlled by a clock signal (H), and also comprises, at least between two master-slave flipflops (M/S), a switching device (C) which enables selection of a serial loading mode or a parallel loading mode for the preceding flipflop. The switching device (C) contains a differential stage (Cs) which is used in the serial mode and which is composed of a pair of transistors (T1, T2), and a differential stage (Cp) which is used in the parallel mode and which consists of at least two differential pairs of transistors (T3, T4 and T3', T4') which are connected in parallel, only a part of the transistors of the output branch (T4') being connected to the input of the flipflop which succeeds the switching device, so that saturation of the input transistor (Te) of this flipflop (M/S) in the parallel loading mode is avoided.

1 Claim, 2 Drawing Sheets

FAST DIGITAL SHIFT REGISTER AND ARRANGEMENT COMPRISING SUCH A REGISTER

This is a continuation of application Ser. No. 08/148,103 now abandoned, filed Nov. 3, 1993.

BACKGROUND OF THE INVENTION

The invention relates to a digital shift register, comprising a succession of master-slave flipflops which are controlled by a clock signal for the serial loading of the data present at the input of the shift register, given flipflops being separated by a switching device which comprises:

- a differential stage comprising transistors which is referred to as a serial stage,
- a differential stage comprising transistors which is referred to as a parallel stage,
- and a switching circuit which enables a current, referred to as a current of nominal value, to be applied either to the serial stage or to the parallel stage, according to a selection signal, in order to load the flipflop succeeding this switching device either in the serial or in the parallel mode on the basis of data present either at an input of the serial stage or at an input of the parallel stage.

A shift register of this kind finds important applications, notably for the digital processing of a video signal downstream from analog-to-digital converters. Actually, for given applications, for example when all data to be storm in the register is available at the same time, serial loading would constitute a loss of time.

A shift register which can be loaded either in the serial or in the parallel mode is described in the article "A 2.25-GHz silicon bipolar shift register" by U. Langmann, extract of "Proceedings of the 1987 bipolar circuits and technology meeting", pp. 109–112 (J. Jopke editor, published by the IEEE). This shift register is realised in CML (Current Mode Logic).

SUMMARY OF THE INVENTION

It is an object of the invention to propose a shift register which can be loaded either in the serial or in the parallel mode and which is realised in CRL (Current Routing Logic). The principle and the many advantages of this logic are described in the article "Analysis and improvement of a static shift register", by D. Kasperkovitz, published in "Microelectronics & Reliability, pp. 501–515, Pergamon Press 1974".

To achieve this, a shift register of the kind set forth in accordance with the invention is characterized in that, the master-slave flipflops being realised with CRL cells, the switching device comprises a resistance which is connected between the input of the serial stage and a supply voltage terminal, and in that, the differential stages of each switching device being composed of at least an input transistor and at least an output transistor connected, by way of its collector, to the input of the flipflop succeeding the switching device, the parallel stage comprises a plurality of output transistors whose emitters and bases are connected in parallel and only a part of which are connected, by way of their collector, to the input of the flipflop succeeding the switching device, so that the current supplied by the parallel stage is equal to a fraction of the current of nominal value.

The invention thus offers a solution to a major problem associated with the use of CRL logic: the risk of saturation of the input transistor of the master cell of the master-slave flipflop succeeding the switching device during loading in the parallel mode.

In a preferred embodiment of a shift register in accordance with the invention, the parallel stage of the switching device comprises two output transistors whose emitters and bases are connected in parallel, only one of the output transistors being connected, by way of its collector, to the input of the flipflop succeeding the switching device, the collector of the other output transistor being connected to the supply voltage terminal.

This embodiment offers the advantage that it can be particularly simply implemented.

It is also an object of the invention to propose an arrangement comprising such a shift register and supplying a selection signal whose active duration encloses the active period of the clock signal.

Thus, acquisition of an input signal of the parallel stage by the master flipflop is ensured.

BRIEF DESCRIPTION OF THE DRAWINGS

Other particularities, details and advantages of the invention will be underscored by the following description, given with reference to the accompanying drawings which relate to non-limitative examples; therein.

DETAILED DESCRIPTION OF PREFERRED EMBODIMENTS OF THE INVENTION

Figure 1:
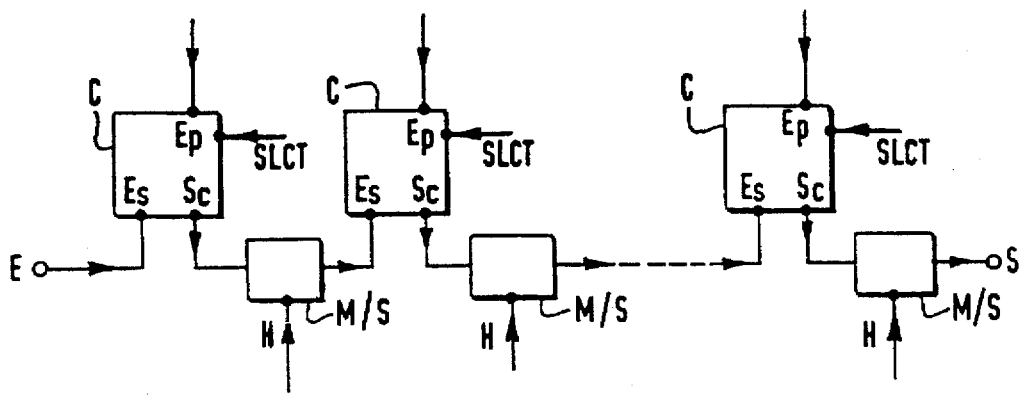
FIG. 1 shows a diagram of an embodiment of a shift register which can be loaded either in the serial or in the parallel mode.

As is shown in FIG. 1, a shift register which can be loaded either in the serial or in the parallel mode comprises an input E which is used in the serial mode and which is connected to an input Es of a switching device C. It is formed by a succession of master-slave flipflops M/S, each of which is preceded by a switching device C so that the input of each flipflop M/S is connected to the output Sc of a switching device C and that the output of each flipflop M/S is connected to the input Es, used in the serial mode, of another switching device C. The output of the last flipflop M/S constitutes the output S of the shift register. Each switching device C also comprises an input Ep which is used in the parallel mode. A clock signal H enables control of the master-slave flipflops M/S and a selection signal SLCT enables selection of the loading mode of the switching devices C.

In the present embodiment, all master-slave flip flops M/S of the shift register are simultaneously loaded when all switching devices C operate in the parallel mode. This enables direct accessing of the data loaded into the last flipflop.

Depending on the applications of this shift register, it is feasible to omit some of these switching devices C. Notably the input signal could be applied directly to the first flipflop M/S of the shift register.

Figure 2:
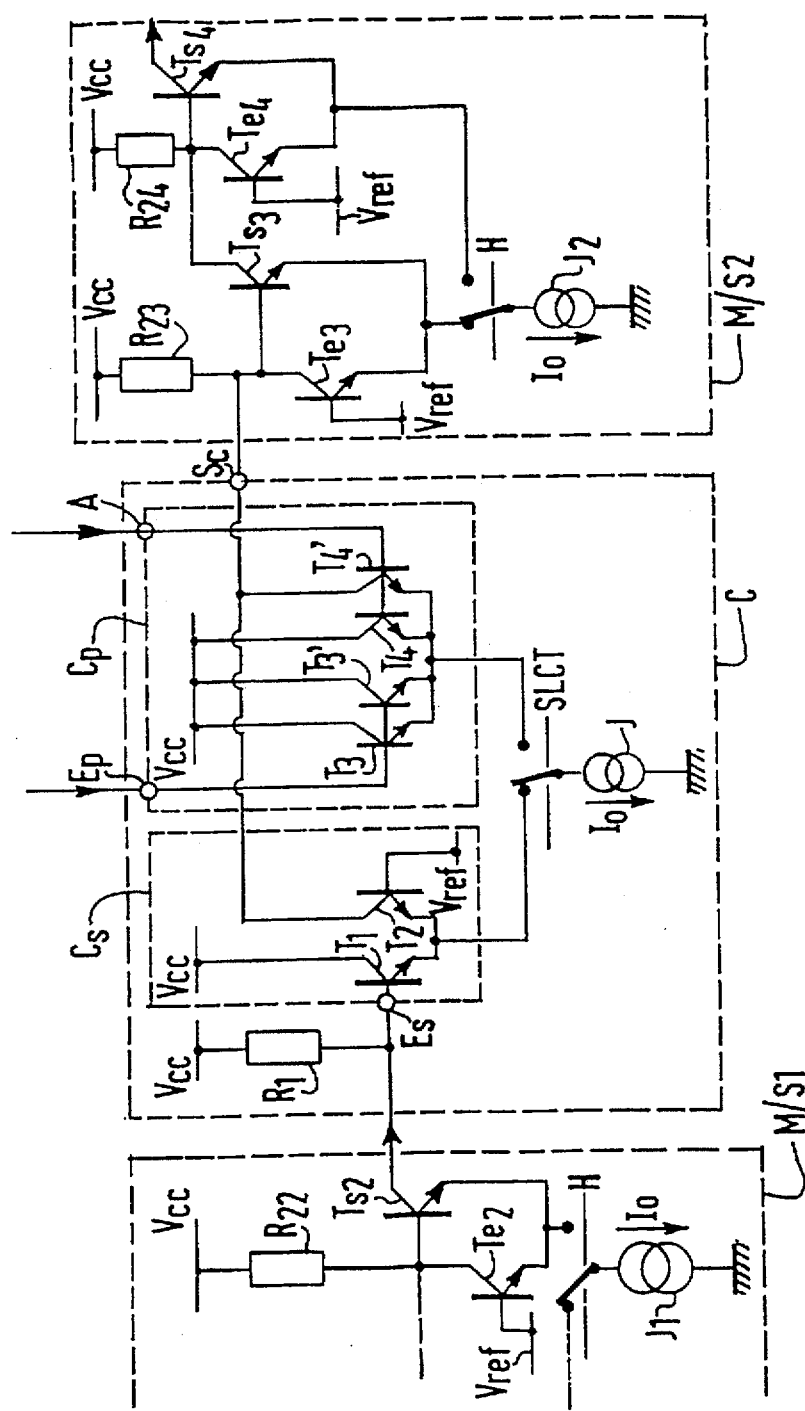
FIG. 2 shows the electrical diagram of an embodiment of a switching device of a shift register in accordance with the invention.

FIG. 2 shows a switching device C in accordance with the invention which is connected between a slave cell of a first master-slave flipflop M/S1 and a second master-slave flipflop M/S2, both flipflops being realised in CRL logic.

The slave cell of the first master-slave flipflop M/S1 comprises an input transistor Te2 and an output transistor Ts2 which are interconnected by way of their emitters. These emitters are connected to a current source J1 which supplies a current of nominal value Io, be it exclusively when the level of a clock signal H is low. On the other hand, the collector of the input transistor Te2 and the base of the output transistor Ts2, constituting the input of the slave cell, are connected to a supply voltage terminal Vcc via a resistance R22. Finally, the base of the input transistor Te2 is connected to a reference voltage terminal Vref. The collector of the output transistor Ts2 constitutes the output of the slave cell.

This output is connected to the input Es of the switching device C. The switching device C comprises a first differential stage Cs comprising transistors, referred to as a serial stage, and a second differential stage Cp comprising transistors, referred to as a parallel stage.

The serial stage Cs is composed of two transistors T1 and T2. The base of the transistor T1, constituting the input of the serial stage Cs, is connected on the one hand to the input Es of the switching device C and on the other hand to the supply voltage terminal Vcc, via a resistance R1. Its collector is connected to a supply voltage terminal Vcc, the base of T2 being connected to the reference voltage terminal Vref and its collector to the output Sc of the switching device C. The emitters of the two transistors T1 and T2 are connected to a current source J which supplies a current of nominal value Io, be it exclusively when the level of a selection signal SLCT is low.

The parallel stage Cp is composed of four transistors T3, T3', T4 and T4'. The bases of the transistors T3 and T3', constituting the input of the parallel stage Cp, are connected to the parallel input Ep of the switching device C, and their collectors are connected to the supply voltage terminal Vcc. The bases of the transistors T4 and T4', being connected to a point A, receive the logic inverse of the input signal used in the parallel mode in a first embodiment, and a reference voltage $V_A$, selected according to the nature of the data loaded in the parallel mode, in a second embodiment. The collector of the transistor T4 is connected to a supply voltage terminal Vcc and that of the transistor T4' to the output Sc of the switching device C. The emitters of the four transistors are connected to the current source J, be it exclusively when the level of the selection signal SLCT is high. The output Sc of the switching device C is connected to the input of the second master-slave flipflop M/S2.

This flipflop M/S2 is composed of a master cell and a slave cell, constructed as described for the slave cell of the first flip flop M/S1: the master cell comprises a resistance R23, an input transistor Te3 and an output transistor Ts3; the slave cell comprises a resistance R24, an input transistor Te4 and an output transistor Ts4. The master cell is fed by a current source J2 which supplies a current of nominal value Io, be it exclusively when the level of the clock signal H is high. The slave cell is fed by the same source J2, be it exclusively when the level of the clock signal H is low.

When the shift register is loaded serially, the selection signal SLCT is, therefore, applied in its low state and the serial stage Cs is fed by the current Io whereas the parallel stage Cp is not fed. If the input signal is logic high, the transistor T1 is turned on whereas the transistor T2 is turned off. Therefore, no current whatsoever is applied to the resistance R23 of the flipflop M/S2 and the potential Usc at the output Sc of the switching device C is high.

However, if the input signal is logic low, the transistor T1 is turned off and the transistor T2 is turned on, thus applying a current close to Io to the resistance R23. The potential Usc at the output Sc of the switching device C, therefore, is low.

When the register is loaded in parallel, the selection signal SLCT is applied in its high state and the serial stage Cs is not fed. If the input signal is logic high, the transistors T3 and T3' are turned on whereas T4 and T4' are turned off. Therefore, they do not apply any current whatsoever to the resistance R23 and the potential Usc at the output Sc of the switching device C is high.

However, if the input signal is logic low, the transistors T4 and T4' are turned on. The transistor T4' thus applies a current Io/2 to the resistance R23 and, as soon as the master cell of the flipflop M/S2 becomes active, the potential Usc at the output Sc of the switching device becomes low.

The double structure of the parallel stage Cp thus enables the output current to be limited to Io/2 in the case of parallel operation, i.e. when the selection signal SLCT is high. Saturation of the input transistor Te3 of the master cell of the flipflop M/S2 is thus avoided when the input signal is low. Actually, in the event of the parallel mode of operation with an active master cell, i.e. when the selection signal SLCT and the clock signal H are high, the current flowing in the resistance R23 is equal to the sum of the current Io/2 supplied by the transistor T4' of the parallel stage and the current Io supplied by the transistor Te3 of the master cell of the flipflop M/S2. Therefore, the potential at the output Sc of the switching device C equals:

$$Usc = Vcc - 3RIo/2,$$

so that the saturation which would be reached in the case of a single structure of the parallel stage Cp is avoided: the level of the input signal being low, the transistors Te3 and Te4' would each supply a current Io and the potential at the output Sc of the switching device C would be equal to:

$$Use = Vcc - 2RIo.$$

Figure 3:
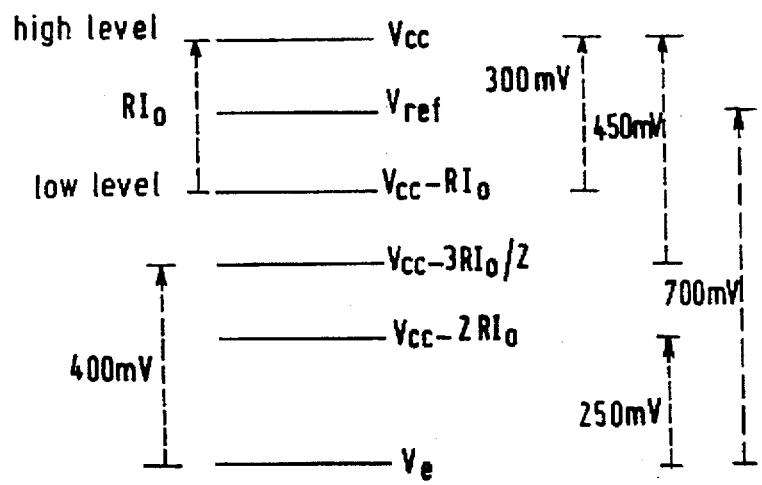
FIG. 3 shows a diagram representing the levels of various signals occurring during operation of the shift register in accordance with the invention.

FIG. 3 shows the levels of various voltages. The voltage Vcc corresponds to the logic high level, the voltage (Vcc–RIo) corresponds to the logic low level, the reference potential Vref is preferably chosen to be equal to the central level between these two logic levels, and the voltage Ve is the emitter voltage of the transistor Te3. For example, if the swing of the signal is chosen to be equal to 300 mV:

$$RIo = 300 \text{ mV}$$

$$3RIo/2 = 450 \text{ mV}.$$

In the case of a single structure of the parallel stage Cp, the collector-emitter voltage Vce of the transistor Te3 then equals:

$$Vce = Usc + Vbe - Vref$$

$$Vce = Vcc - 2RIo + Vbe - Vcc + RIo/2$$

$$Vce = Vbe - 3RIo/2.$$

Considering, for example that Vbe, being the base-emitter voltage of the transistor Te3, is equal to 700 mV, there is obtained:

$$Vce = 250 \text{ mV}.$$

The saturation level is thus reached.

In the case of a double structure of the parallel stage Cp, the voltage Vce is in the same way equal to:

$$Vce = Vbe - Rlo$$

$$Vce = 400 \text{ mV}$$

The saturation is thus avoided.

It is to be noted that the risk of saturation does not exist in the serial loading mode. Actually, when the master cells are active, the slave cell of the flipflop M/S1 is not fed. The potential at the input Es of the switching device C, therefore, is high and hence the transistor T1 is turned on. The switching device, therefore, does not apply any current to the resistance R23.

Figure 4:
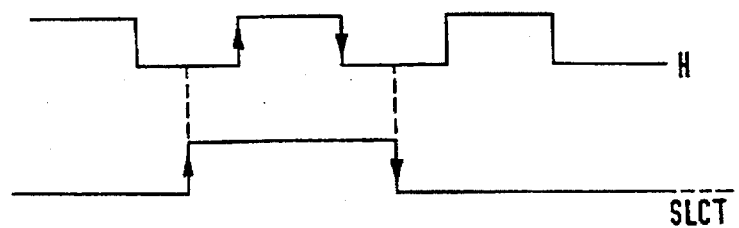
FIG. 4 shows a diagram representing the clock signal and the selection signal as a function of time.

FIG. 4 shows the selection signal SLCT and the clock signal H as a function of time. The positive-going edge of the selection signal SLCT leads that of the clock signal H in order to ensure that the data to be stored will be present at the inputs of each switching device when the master cell enters the read phase. The negative-going edge of the selection signal SLCT lags that of the clock signal H so that the input data remains stable throughout the read phase of the master cell.

This overlapping of the active durations of the two signals SLCT and H enables the use of a double structure for the parallel stage Cp. Actually, the input signal used in the parallel mode being low, the output current of the switching device C is limited to Io/2 and the potential Usc at its output Sc will not become low except when the master cell becomes active. This signifies that the low state will be stored only if the active durations of the selection signal SLCT and the clock signal H overlap.

Even though the invention has been described on the basis of a specific embodiment, it is to be understood that alternative versions can be readily imagined and implemented by those skilled in the art, without departing from the scope of the present invention.

Notably the active levels of the clock signal H and the selection signal SLCT can be chosen so as to correspond to a logic low level.

On the other hand, in the described structure for limiting the output current in the case of parallel loading, the number N of output transistors of the parallel stage equals two, only one of these transistors being connected, by way of its collector, to the output Sc of the device. This value of N is particularly suitable, because it enables the desired result to be obtained by means of a simple structure; however, other values can also be used. The number of transistors whose collectors are connected to the output of the device is then determined so that the current available at the output of the device is equal to a fraction of between 1 and ½ of the current Io supplied by the current source J.

Finally, in the foregoing description the swing of the signal has been chosen to be equal to 300 mV. This value is particularly suitable, because on the one hand the saturation is not approached too closely and on the other hand the device is not too sensitive to noise. It is to be understood, however, that this value is not limitative and that other close values could also be suitable.

Moreover, the first reference voltage Vref has preferably been chosen to be equal to the central level between the logic high level and the logic low level. Other values of Vref between these two levels could be determined by those skilled in the art.

I claim:

1. A digital shift register including a succession of flip-flops controlled by a clock signal for the serial loading of data present at an input of the shift register and a switching device interposed between successive flip-flops, said switching device comprising:

a differential serial stage;

a switching circuit coupled to said differential serial stage; and a differential parallel stage coupled to said switching circuit;

said switching circuit responsive to a selection signal for enabling a current having a nominal value to be applied to one of the differential serial stage and the differential parallel stage;

said differential parallel stage including a first output transistor having a collector, base and emitter and a second output transistor having a collector, base and emitter, the emitter of the first output transistor coupled to the emitter of the second output transistor and the base of the first output transistor coupled to the base of the second output transistor and the collector of the second output transistor coupled to one of the successive flip-flops.

* * * * *